(12) United States Patent  
Park et al.

(10) Patent No.: US 7,459,359 B2
(45) Date of Patent: Dec. 2, 2008

(54) METHODS OF FABRICATING VERTICAL CHANNEL FIELD EFFECT TRANSISTORS HAVING INSULATING LAYERS THEREON

(75) Inventors: Tai-Su Park, Seoul (KR); Eui-Joon Yoon, Seoul (KR); U-In Chung, Seoul (KR); Si-Young Choi, Gyeonggi-do (KR); Jong-Ho Lee, Seoul (KR)

(73) Assignee: Samsung Electronic Co., Ltd. (KR)

( * ) Notice: Subject to any disclaimer, the term of this patent is extended or adjusted under 35 U.S.C. 154(b) by 39 days.

(21) Appl. No.: 11/556,804

(22) Filed: Nov. 6, 2006

(65) Prior Publication Data

US 2007/0066018 A1    Mar. 22, 2007

Related U.S. Application Data

(62) Division of application No. 10/780,067, filed on Feb. 17, 2004, now Pat. No. 7,148,541.

(30) Foreign Application Priority Data

Feb. 19, 2003    (KR) .................... 10-2003-0010402

(51) Int. Cl.
*H01L 21/336* (2006.01)
*H01L 21/8234* (2006.01)

(52) U.S. Cl. ................................ 438/197; 257/E21.014

(58) Field of Classification Search ................ 438/197, 438/300, 304; 257/E21.014
See application file for complete search history.

(56) References Cited

U.S. PATENT DOCUMENTS

| 4,835,584 | A  | 5/1989 | Lancaster |
| 6,242,783 | B1 | 6/2001 | Ohmi et al. |
| 6,355,532 | B1 | 3/2002 | Seliskar et al. |
| 6,525,403 | B2 | 2/2003 | Inaba et al. |
| 6,885,055 | B2 | 4/2005 | Lee |
| 6,998,676 | B2 | 2/2006 | Kondo et al. |

OTHER PUBLICATIONS

Fu-Liang Yang, et al., "2002 Symposium in VLSI Technology Digest of Technical Power," *IEEE*, 2002.
Shengdong Zhang, et al., "Implementation and Characterization of Self-Aligned Double-Gate TFT With Thin Channel and Thick Source/Drain," *IEEE*, vol. 49, No. 5, May 2002.
Yang-Kyu Choi et al., "A Spacer Patterning Technology for Nanoscale CMOS," *IEEE*, vol. 49, No. 3, Mar. 2002.

*Primary Examiner*—W. David Coleman
(74) *Attorney, Agent, or Firm*—Myers Bigel Sibley & Sajovec, P.A.

(57) ABSTRACT

A method of forming a field effect transistor includes forming a vertical channel protruding from a substrate including a source/drain region junction between the vertical channel and the substrate, and forming an insulating layer extending on a side wall of the vertical channel toward the substrate to beyond the source/drain region junction. The method may also include forming a nitride layer extending on the side wall away from the substrate to beyond the insulating layer, forming a second insulating layer extending on the side wall that is separated from the channel by the nitride layer, and forming a gate electrode extending on the side wall toward the substrate to beyond the source/drain region junction.

12 Claims, 20 Drawing Sheets

METHODS OF FABRICATING VERTICAL CHANNEL FIELD EFFECT TRANSISTORS HAVING INSULATING LAYERS THEREON

CROSS-REFERENCE TO RELATED APPLICATIONS

This application is a divisional of U.S. application Ser. No. 10/780,067; Filed Feb. 17, 2004, now U.S. Pat. No. 7,148,541 which claims priority to Korean Patent Application No. 10-2003-0010402, filed on Feb. 19, 2003, in the Korean Intellectual Property Office, the disclosures of which are incorporated herein by reference in their entireties.

FIELD OF THE INVENTION

The present invention relates to semiconductor devices, and more specifically, to field effect transistors with vertical channels and methods of fabricating the same.

BACKGROUND OF THE INVENTION

Several problems, such as short channel effects and drain induced barrier lowering (DIBL) effects, can occur when transistor size is decreased. For example, if the channel width of the transistor is reduced to less than 50 nm, distribution of device characteristics may increase, and if the channel width is reduced to less than 30 nm, short channel effects and DIBL effects may occur, thereby hindering normal operation of the transistor.

In order to overcome these problems, studies on dual gate transistors have increased. Some dual gate transistors can include a channel with a thickness of less than 30 nm and a gate that is positioned either surrounding the channel or at both sides thereof. A conventional transistor can have a single gate electrode formed only on top of the channel structure, such that the electric field created by the gate voltage is anisotropically applied to the channel. Thus, the transistor may not be effectively controlled by the gate electrode, which may cause short channel effects.

In contrast, dual gate transistors may have gate electrodes formed on both sides of a thin channel, thereby allowing every portion of the channel region to be controlled by the gate electrode. Accordingly, current between the source and drain can be lowered when the transistor is off, power dissipation can be reduced, and on/off operations of the transistor can be effectively controlled.

A dual gate transistor formed in silicon on insulator (SOI) can prevent formation of parasitic transistors and can be easily used in conventional methods of forming transistors. FinFETs with a fin and a gate electrode are discussed in "2002 Symposium on VLSI Technology Digest of Technical Paper" by Fu-Liang Yang et al. As discussed in Yang, the fin is formed on an insulating layer of SOI substrate and the gate electrode is positioned over the fin. A double gate transistor with upper and lower gates and a parallel channel pattern is discussed in "Implementation and Characterization of Self-Aligned Double-Gate TFT with Thin Channel and Thick Source/Drain" by Shengdong Zhang et al., "IEEE TRANSACTIONS ON ELECTRON DEVICES, VOL. 49, No. 5, MAY 2002". In Zhang, the upper and lower gates are self-aligned to an insulating layer and the parallel channel pattern is interposed between the lower and upper gates. Dual gate transistors are also discussed in, for example, "A Spacer Patterning Technology for Nanoscale CMOS" by Yang-Kyu Chio, "IEEE TRANSACTIONS ON ELECTRON DEVICES, VOL. 49, No. 3, MARCH 2002". However, the transistors discussed in the above references are formed on SOI substrate, which can contribute to several problems, such as floating body effect, inferior thermal conductivity, expensive wafer price, and high defect density of the SOI substrate.

A dual gate transistor formed on a bulk silicon substrate (instead of the SOI substrate) is discussed in U.S. Pat. No. 6,355,532, "SUBTRACTIVE OXIDATION METHOD OF FABRICATING A SHORT-LENGTH AND VERTICALLY-ORIENTED CHANNEL, DUAL-GATE, CMOS FET" by John J. Seliskar et al. According to Seliskar, impurities can be implanted in the substrate between the channel segments during formation of the source and drain regions.

FIG. 1 is a cross-sectional view showing a conventional dual gate transistor formed on a bulk silicon substrate.

Referring to FIG. 1, a field oxide layer 20 is formed on the semiconductor substrate 10, and the substrate defined by the field oxide layer 20 is etched to form vertically protruding channel segments 12 that are laterally separated from one another. A gate electrode 14 is formed over the channel segments 12, and a gate oxide layer is formed between the gate electrode 14 and the channel segments 12.

FIG. 2 is a perspective view showing a portion of a conventional dual gate transistor formed on a bulk silicon substrate.

Referring to FIG. 2, a gate electrode 14 is positioned over the vertically protruding channel segments 12. Impurities are implanted into the silicon substrate at both sides of the gate electrode 14 to form source and drain regions (S/D), respectively. As discussed above, conventional vertical channel transistors can have source and drain regions formed not only in the channel segments 12, but also in the substrate adjacent to the channel segments 16. The channel segments 12 are surrounded by the gate electrode 14, such that full depletion or full inversion can occur where the channel length is short. However, intrinsic transistors 15 may be formed in the substrate adjacent to the protruding channel segments 12 and may possibly cause DIBL effects, which can be typical in transistors with parallel channels.

FIG. 3 is a perspective view showing a conventional vertical channel transistor formed in SOI substrate.

Referring to FIG. 3, the transistor includes a SOI layer 24 with a plurality of parallel fins 30 formed on a buried oxide layer 22, a mask oxide layer 26 formed on the SOI layer 24, and a gate electrode 28 positioned over the mask oxide layer 26 and the fins 30. The gate electrode 28 includes a polysilicon layer 28a under the gate electrode and a low resistance layer 28b on the polysilicon layer 28a. The transistor is formed on the buried oxide layer 22 and is separated from the substrate, which can cause low thermal conductivity and floating body effects.

SUMMARY

Embodiments according to the invention can provide vertical channel field effect transistors. Pursuant to these embodiments, a transistor can include a vertical channel protruding from a substrate with a source/drain region junction between the vertical channel and the substrate, and an insulating layer extending on a side wall of the vertical channel toward the substrate to beyond the source/drain region junction. The insulating layer may further extend on a top surface of the channel.

In some embodiments according to the invention, the transistor can further include a nitride layer extending on the side wall away from the substrate to beyond the insulating layer, a second insulating layer extending on the side wall and separated from the channel by the nitride layer, and a gate electrode extending on the side wall toward the substrate to beyond the source/drain region junction. The nitride layer can be formed so that it is absent from beyond the junction.

According to further embodiments of the invention, the width of the vertical channel may not be uniform. For example, the channel can have a width that gradually increases toward the substrate. Alternatively, the channel can have an upper width and a lower width, wherein the upper width of the channel is uniform and the lower width of the channel gradually increases toward the substrate.

In some embodiments of the invention, the transistor may include a mask insulating layer extending on a top surface of the channel. The mask insulating layer may include an etch stop nitride layer and a pad oxide layer, and may further include a pad nitride layer. Also, the mask insulating layer may include alternating oxide and nitride layers.

According to further embodiments of the invention, a transistor can be formed by connecting transistors according to some of the above embodiments, which may improve current driving capacity. For example, the transistor can include a plurality of vertical channels protruding from a substrate having respective source/drain region junctions between the plurality of vertical channels and the substrate, and a plurality of insulating layers extending on respective side walls of the plurality of vertical channels toward the substrate to beyond the respective source/drain region junctions.

In some embodiments, the transistor can include at least one planar region connected to the plurality of vertical channels. The transistor can also include a plurality of nitride layers extending on the respective side walls away from the substrate to beyond the plurality of insulating layers, and a gate electrode extending on the respective side walls of the plurality of channels toward the substrate to beyond the respective source/drain region junctions.

According to still further embodiments of the invention, a method of forming a transistor can include forming a vertical channel protruding from a substrate including a source/drain region junction between the vertical channel and the substrate, and forming an insulating layer extending on a side wall and/or top surface of the vertical channel toward the substrate to beyond the source/drain region junction.

In some embodiments of the invention, the method can include forming a nitride layer extending on the side wall away from the substrate to beyond the insulating layer, forming a second insulating layer extending on the side wall, wherein the second insulating layer is separated from the channel by the nitride layer, and forming a gate electrode extending on the side wall toward the substrate to beyond the source/drain region junction. The nitride layer can be formed so that it is absent from beyond the junction.

In further embodiments of the invention, the step of forming a vertical channel can further include forming an oxide layer on the channel, and removing the oxide layer to reduce the width of the channel. In addition, the step of forming a vertical channel can be preceded by forming a mask insulating layer on a substrate. Also, the step of forming an oxide layer can be preceded by forming a pad oxide layer and an oxidation mask layer on the channel, and the step of removing the oxide layer can further include removing the pad oxide layer and the oxidation mask layer. The oxidation mask layer can include alternating oxide and nitride layers.

BRIEF DESCRIPTION OF THE DRAWINGS

The objects and advantages of the present invention will become more apparent by describing in detail embodiments thereof with reference to the attached drawings in which.

DESCRIPTION OF EMBODIMENTS ACCORDING TO THE INVENTION

Figure 1:
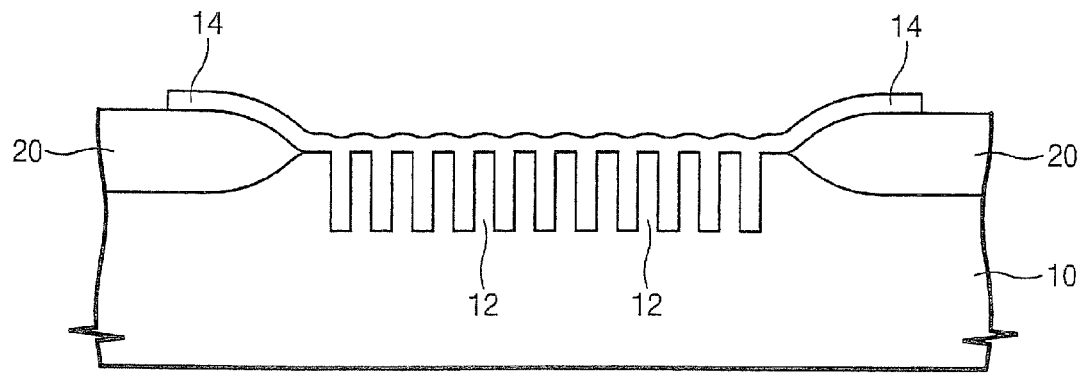
FIGS. 1 through 3 show a conventional vertical channel field effect transistor.
Figure 2:
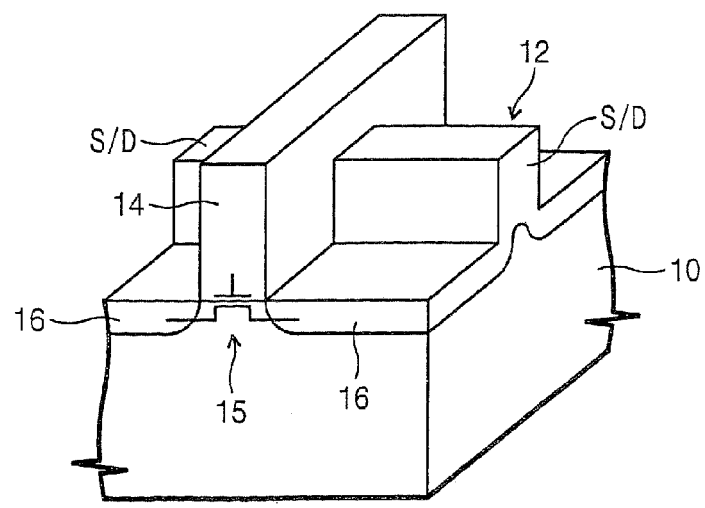
Figure 3:
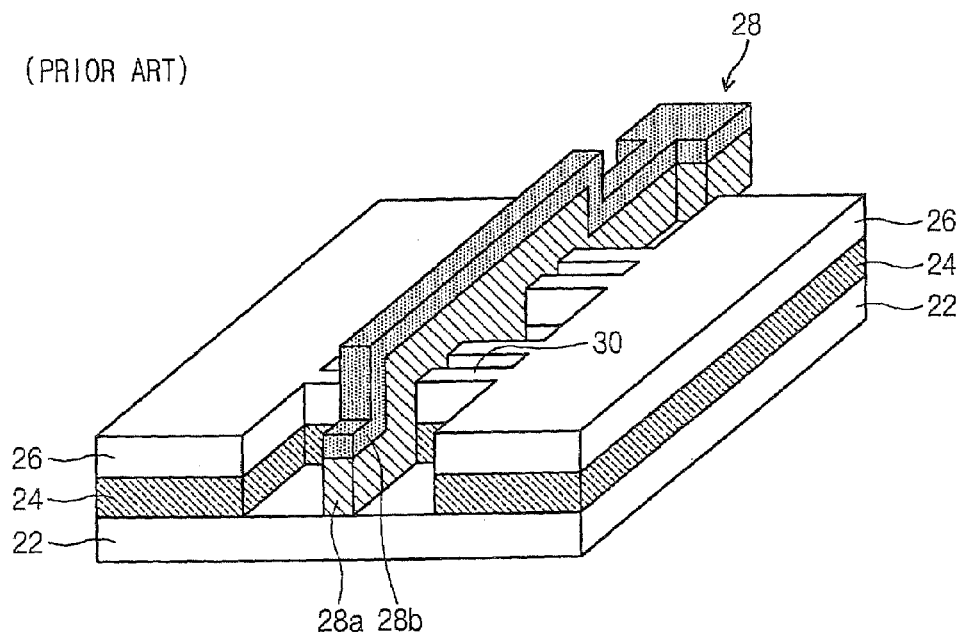

The present invention will now be described more fully hereinafter with reference to the accompanying drawings, in which embodiments of the invention are shown. This invention may, however, be embodied in different forms, and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It should also be understood that when a layer is referred to as being "on" another layer or substrate, it may be directly on the other layer or substrate, or intervening layers may also be present.

Furthermore, relative terms, such as "beneath", are used herein to describe one element's relationship to another as illustrated in the Figures. It will be understood that relative terms are intended to encompass different orientations of the device in addition to the orientation depicted in the Figures. For example, if the device in the Figures is turned over, elements described as "beneath" other elements would be oriented "above" the other elements. The exemplary term "beneath", can therefore, encompasses both an orientation of above and below.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second without departing from the teachings of the present invention. The same reference numerals in different drawings represent the same elements, and thus their description will be omitted.

Figure 4A:
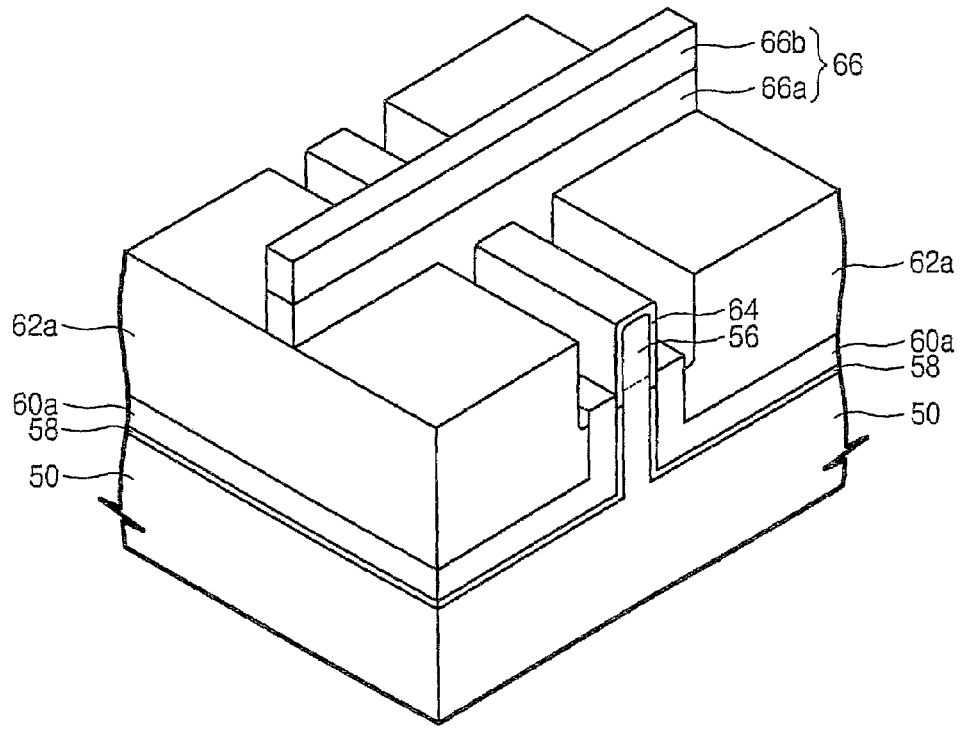
FIG. 4A is a perspective view showing a field effect transistor according to some embodiments of the invention.

FIG. 4A is a perspective view showing a vertical channel field effect transistor according to embodiments of the invention.

Figure 4B:
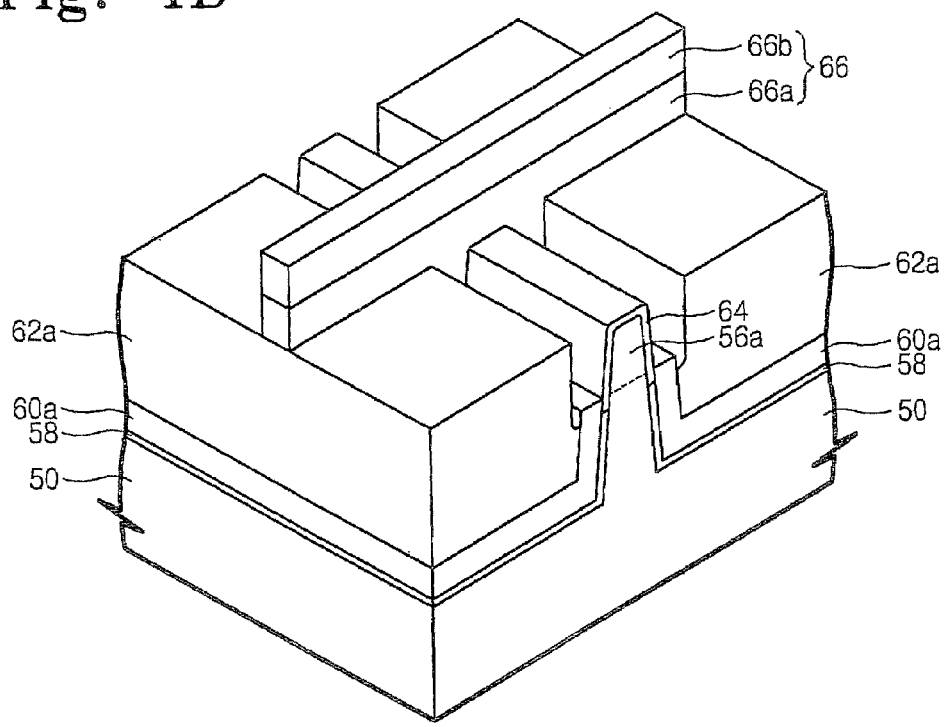
FIGS. 4B and 4C are perspective views showing further embodiments according to the invention.
Figure 4C:
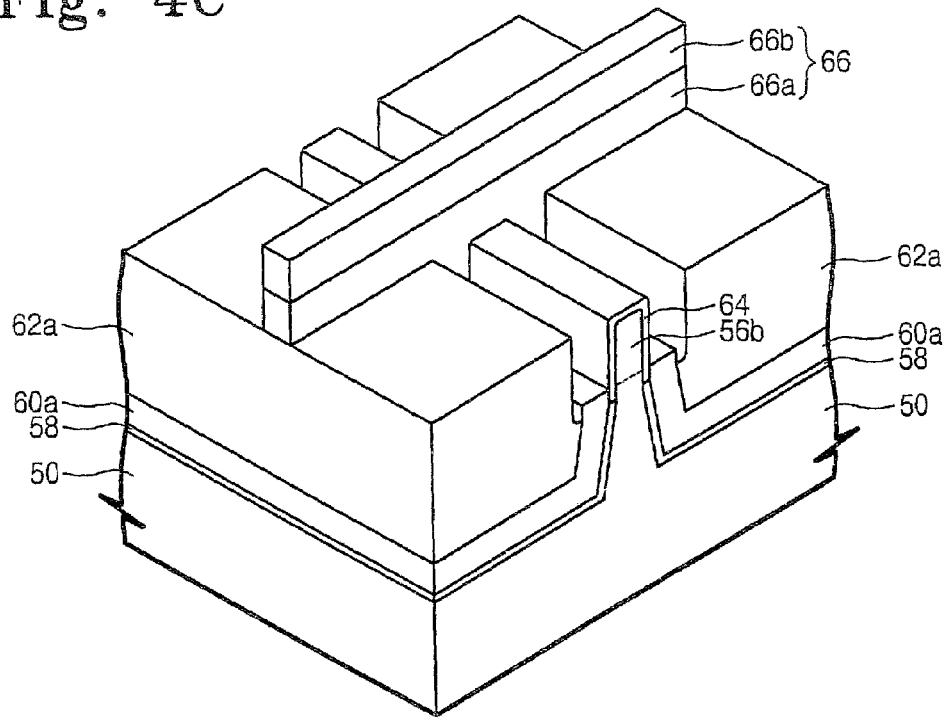

FIGS. 4B and 4C are perspective views showing further embodiments according to the invention.

Referring to FIG. 4A, a transistor according to some embodiments of the invention includes a fin 56 that is a vertically protruding portion of semiconductor substrate. A buffer oxide layer 58 is formed on the substrate. The buffer oxide layer 58 is formed on the lower sidewalls of the fin 56, and a gate insulating layer 64 is formed on the upper sidewalls of the fin 56. The buffer oxide layer 58 and the gate insulating layer 64 form a boundary at a height above the substrate 50. The fin 56 may be formed 50-1000 nm in height, and the buffer oxide layer 58 may be formed about 2-50 nm in height. The gate insulating layer 64 may be formed of thermal oxide, CVD oxide, or nitride. The thickness and material of the layer can be selected according to the characteristic needs of the devices. A nitride liner 60a is formed on the buffer oxide layer 58, neighboring the lower sidewall of the fin 56 and extending on the sidewall away from the substrate 50 to beyond the gate insulating layer 64. A device isolation layer 62a is formed adjacent to the fin 56, and is separated from the fin 56 by the nitride liner 60a. The device isolation layer 62a is formed to define recesses on both sides of the fin 56. The nitride liner 60a may be formed to thickness of 5-200 nm. The height of the fin 56 which protrudes over the nitride liner 60a defines the channel width of the transistor. The fin 56 may be formed to thickness of about 10-500 nm. A gate electrode 66 crosses over (i.e. is positioned on) the fin 56. The gate electrode 66 may be a stacked structure of low resistance conductive layers 66b, such as metal, metallic silicide, and polysilicon or polysilicon germanium (SiGe). As illustrated in FIG. 4A, the top surfaces of the fin 56 and the device isolation layer 62a may be of similar height or different in height. In some embodiments according to the invention, the top edges of the fin 56 are rounded. The portion of the fin 56 protruding from the nitride liner 60a is surrounded by the gate electrode 66, defining the channel width of the transistor. In addition, the top surface of the gate electrode 66 may be planar, because of the ratio of the entire device region to the region between the fin 56 and the device isolation layer 62a. Although not shown in the drawing, impurities may be implanted into the fin 56 at both sides of the gate electrode 66 to form the source and drain regions of the transistor. A channel region may be formed in the fin 56 with or without implanted impurities. In some embodiments, the gate electrode 66 extends toward the substrate 50 to beyond the junction boundaries of the source and drain regions, to reduce the likelihood of parasitic transistor formation.

As illustrated in FIGS. 4B and 4C, the fin of the transistor may be wider at the bottom than at the top. The fin 56a of FIG. 4B gradually becomes wider from top to bottom.

Alternatively, an upper portion of the fin 56b of FIG. 4C is uniform in width, but a lower portion thereof becomes wider from top to bottom. The portion where the vertical channel is formed (i.e. the region surrounded with the gate insulating layer 64) may have uniform width, and the region surrounded by the device isolation layer (i.e. the region coated with the buffer oxide) may be gradually widened toward bottom.

FIGS. 5, 6A, 6B, 6C, and FIGS. 7 through 10 are cross-sectional views showing methods of fabricating vertical channel field effect transistors according to the present invention.

Figure 5:
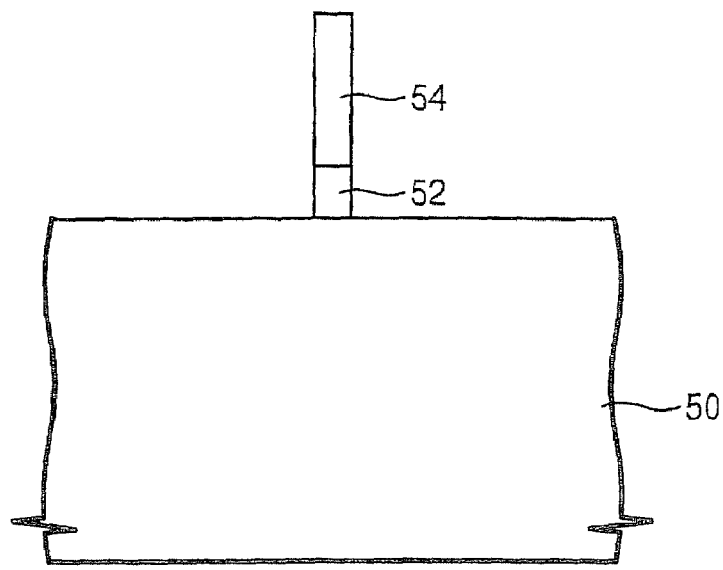
FIGS. 5, 6A, 6B, and 6C and FIGS. 7 through 10 are cross-sectional views showing methods of fabricating a field effect transistor according to some embodiments of the invention.

Referring to FIG. 5, a mask pattern having a photoresist layer 54 over an anti-reflecting layer 52 is formed on a semiconductor substrate 50. The semiconductor substrate 50 may be a bulk substrate of monocrystalline silicon or silicon germanium. The mask pattern can be formed to a minimum width that may be achieved by any photolithographic technique.

Figure 6A:
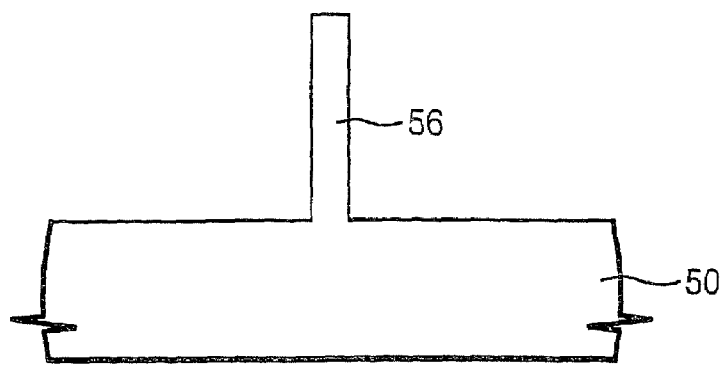

Referring to FIG. 6A, the semiconductor substrate 50 is etched using the mask pattern as an etching mask to form a fin 56, and then the mask pattern is removed. The fin 56 corresponds to an active region, and the etched region around the fin 56 corresponds to a device isolation region. Therefore, the shape and arrangement of the fin 56 can be designed according to the function of the device. The height of the fin 56 may be defined by etching the semiconductor substrate 50-1000 nm.

Figure 6B:
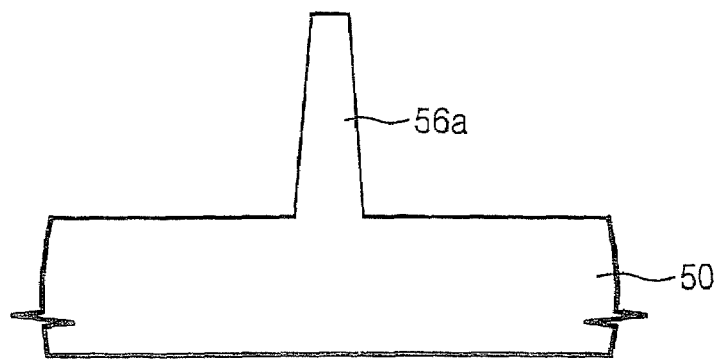
Figure 6C:
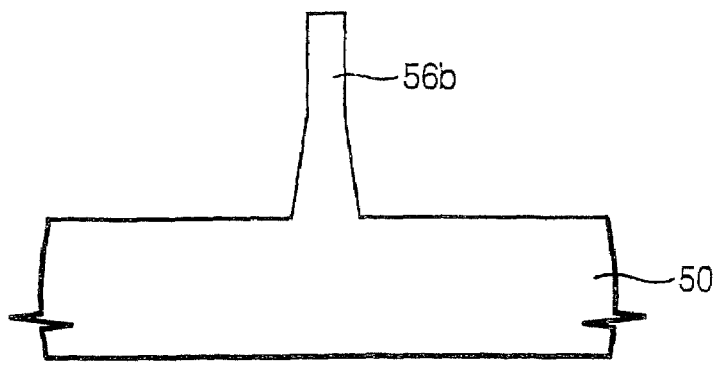

The fin 56 may be formed wider toward the bottom. For example, if HBr gas is introduced while the semiconductor substrate is etched using an etch gas, such as chlorine, a polymer is formed on sidewalls of the etched plane and the etching is restrained. Therefore, if HBr gas is supplied from the beginning of the etching, the fin 56a may gradually increase in width from top to bottom as illustrated in FIG. 6B. If only the etch gas is supplied at the beginning, and HBr is added a predetermined time later, the upper portion of the fin 56b is uniform in width, but the lower portion thereof gradually increases, as illustrated in FIG. 6C.

Figure 7:
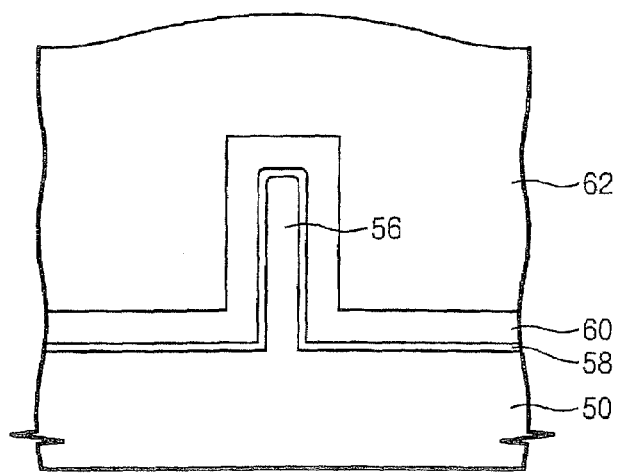

Referring to FIG. 7, a buffer oxide layer 58, a nitride layer 60, and an insulating layer 62 are formed on a semiconductor substrate 50. The buffer oxide layer 58 may be formed of thermal oxide or CVD oxide. When the buffer oxide layer 58 is formed of CVD oxide, deposition may be carried out in thermal oxide ambient in order to cure crystalline defects of the substrate. In this case, the top edges of the fin 56 may be formed rounded. The buffer oxide layer 58 may be conformally formed to a thickness of about 2-50 nm, and the nitride layer 60 may be conformally formed to a thickness of about 5-200 nm. The insulating layer 62 may be formed of an oxide having good gap-fill characteristics, and to a thickness of 100-2000 nm (according to the height of the fin 56) to facilitate planarization in subsequent processing.

Figure 8:
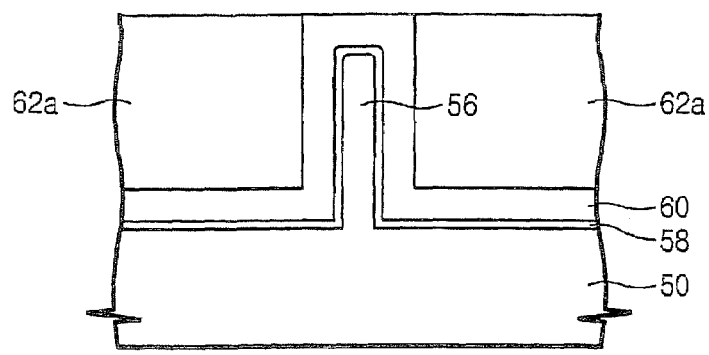

Referring to FIG. 8, the insulating layer 62 is polished by chemical-mechanical polishing to planarize the layer. The planarization process may be performed until the top surface of the nitride layer 60 on the fin 56 is exposed. A device isolation layer 62a is formed around the nitride layer 60.

Figure 9:
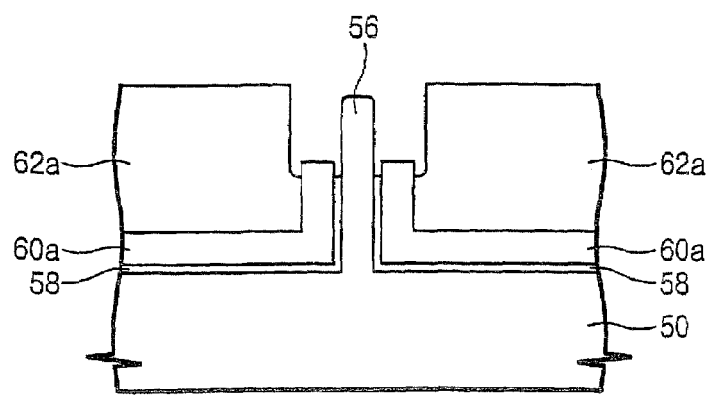

Referring to FIG. 9, the nitride layer 60 on the fin 56 is removed using phosphoric acid or chemical dry etching to expose the top surface of the fin 56. Then, an ion implantation process may be applied to the semiconductor substrate 50 several times to form well, channel, and isolation diffusion layers and the like. The nitride layer 60 and the buffer oxide layer 58 are recessed to expose a portion of a sidewall of the fin 56. As shown in FIG. 9, the buffer oxide layer 58 can be recessed further than the nitride layer 60. In addition, the surface of the device isolation layer 62a is etched during the removal of the buffer oxide layer 58. The channel width of the transistor is defined according to the recessed depth of the nitride layer 60. In other words, the channel width includes the top portion of the fin 56, and the portions of the two sidewalls of the fin 56 extending beyond the nitride layer 60.

Figure 10:
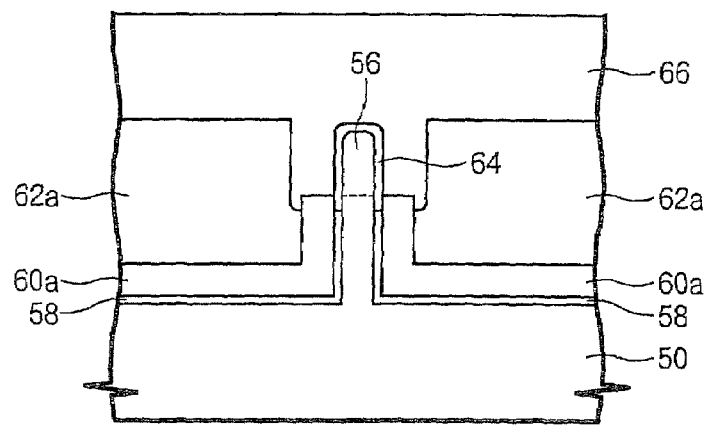

Referring to FIG. 10, a gate insulating layer 64 is formed on the exposed sidewall of the fin 56. The gate insulating layer 64 may be formed of thermal oxide, CVD oxide, metal oxide, silicon nitride, or silicon oxynitride. A conductive layer is formed on an entire surface of the semiconductor substrate, and is then patterned to form a gate electrode 66 crossing over the fin 56. This is essentially the completed structure of FIG. 4. The gate electrode may be formed of conventional polycide or metal. While not illustrated in the drawing, conventional semiconductor fabrication methods may be used for both interconnection and for doping impurities into the fin 56 at both sides of the gate electrode 66 to form source and drain regions.

Figure 11:
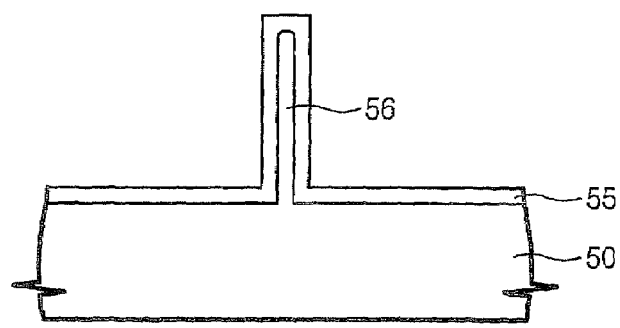
FIGS. 11, 12, 13, and 14 are cross-sectional views showing further embodiments according to the invention.

FIGS. 11 through 14 are cross-sectional views showing methods for forming a fin having a width narrower than that which can be achieved by standard photolithographic techniques, according to further embodiments of the invention. Referring to FIG. 11, a thermal oxidation process is applied to the resultant structures of FIGS. 6A, 6B, and/or 6C to form an oxide layer 55 on a semiconductor substrate 50. As a result, the surface of the fin 56 is oxidized, causing a reduction in the width of the fin 56.

Figure 12:
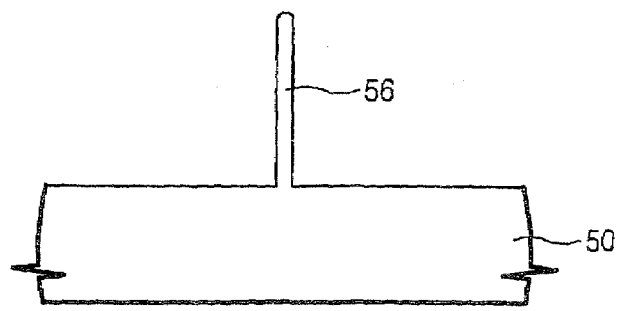

Referring to FIG. 12, the oxide layer 55 is removed to expose the surface of the semiconductor substrate 50. Subsequent processes can be performed in the same way as the discussed above with reference to FIGS. 7 through 10.

Figure 13:
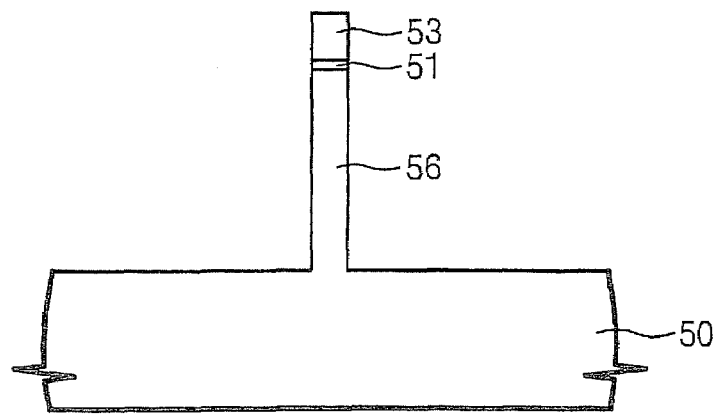
Figure 14:
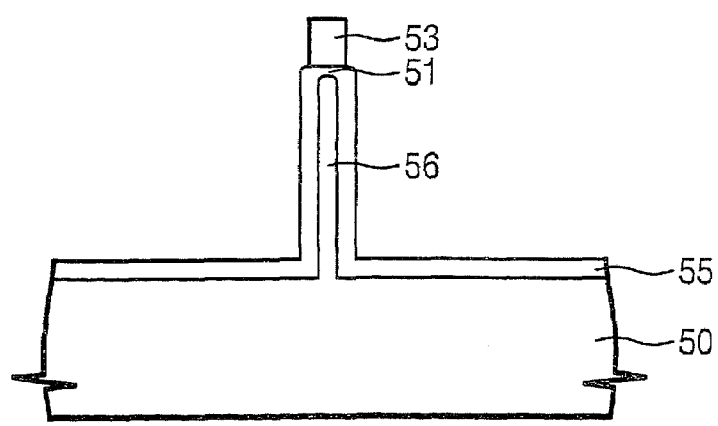

FIGS. 13 and 14 are cross-sectional views showing further embodiments of the invention, which also provide methods for forming a fin having a width narrower than that which can be achieved by photolithographic techniques.

Referring to FIG. 13, a pad oxide layer 51 and an oxidation mask layer 53 are formed on a semiconductor substrate 50. Using a photoresist pattern as an etching mask, the oxidation mask layer 53, the pad oxide layer 51, and the semiconductor substrate 50 are successively patterned to form a fin 56. The oxidation mask layer 53 may be formed of silicon nitride.

Referring to FIG. 14, a thermal oxidation process is applied to the semiconductor substrate 50 to form an oxide layer 55 on the semiconductor substrate 50. The oxidation mask layer 53, the pad oxide layer 51, and the oxide layer 55 are then removed, thereby reducing the width of the fin 56 as compared to that illustrated by FIG. 13. Subsequent processes are performed in the same manner as described above with reference to FIGS. 7 through 11.

Figure 15A:
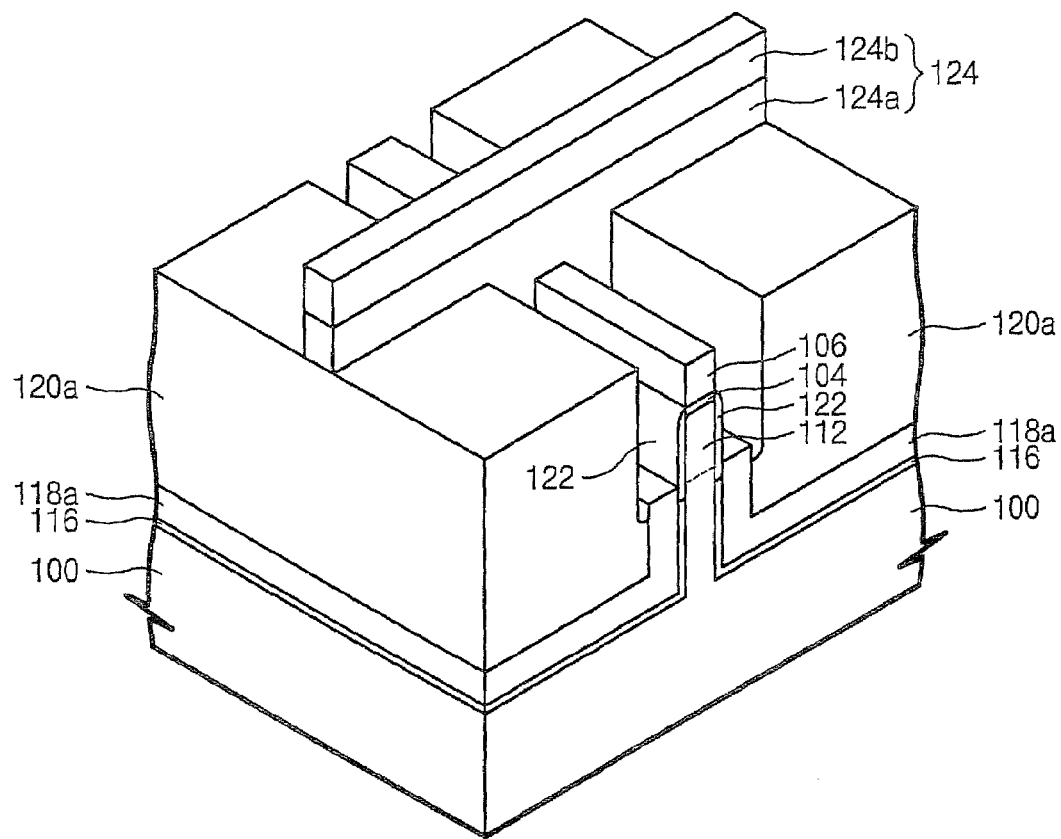
FIG. 15A is a perspective view showing a field effect transistor according to further embodiments of the invention.

FIG. 15A is a perspective view showing a field effect transistor in accordance with further embodiments of the invention.

Referring to FIG. 15A, a mask insulating layer is formed on top of a fin 112. The mask insulating layer is interposed between a gate electrode 124 and the fin 112. The mask insulating layer may be formed of a pad oxide layer 104 and an etch stop nitride layer 106 as illustrated in FIG. 15A, but may include other structures as well. This embodiment further includes a semiconductor substrate 100 with the vertically protruding fin 112, a buffer oxide layer 116 formed on the lower sidewalls of the fin 112, and a gate insulating layer 122 formed on the upper sidewalls of the fin 112, such that the buffer oxide layer 116 and the gate insulating layer 122 form a boundary. A nitride liner 118a is positioned adjacent to the lower sidewall of the fin 112, extending away from the substrate to beyond the gate insulating layer 122, A device isolation layer 120a is positioned on the substrate around the fin 112, and is separated from the fin by the nitride liner 118a. The top surface of the device isolation layer 120a is similar in height to that of the mask insulating layer. Source and drain regions (not shown) are formed in the fin 112 at both sides of the gate electrode 124. A channel region is also formed in the fin 112. The gate electrode 124 may include a multi-layered structure having a stacked polysilicon layer 124a and resistance layers 124b consisting of a metal silicide layer or a metal layer.

As in the embodiments discussed earlier, the top edges of the fin 112 may be formed rounded. In addition, the fin 112a may increase in width toward the bottom (FIG. 15B), or alternatively, the upper portion of the fin 112b may be uniform in width and the lower portion of the fin 112b may gradually increase in width (FIG. 15C).

Figure 15B:
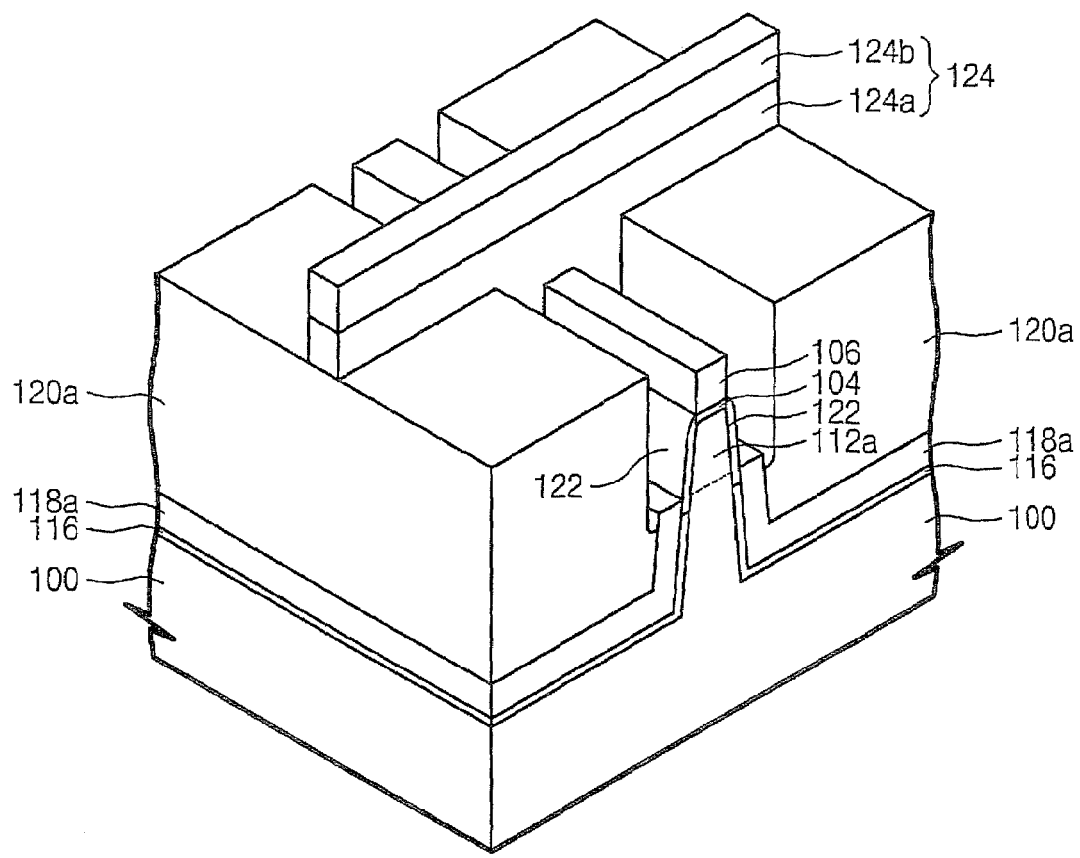
FIGS. 15B and 15C are perspective views showing further embodiments according to the invention.
Figure 15C:
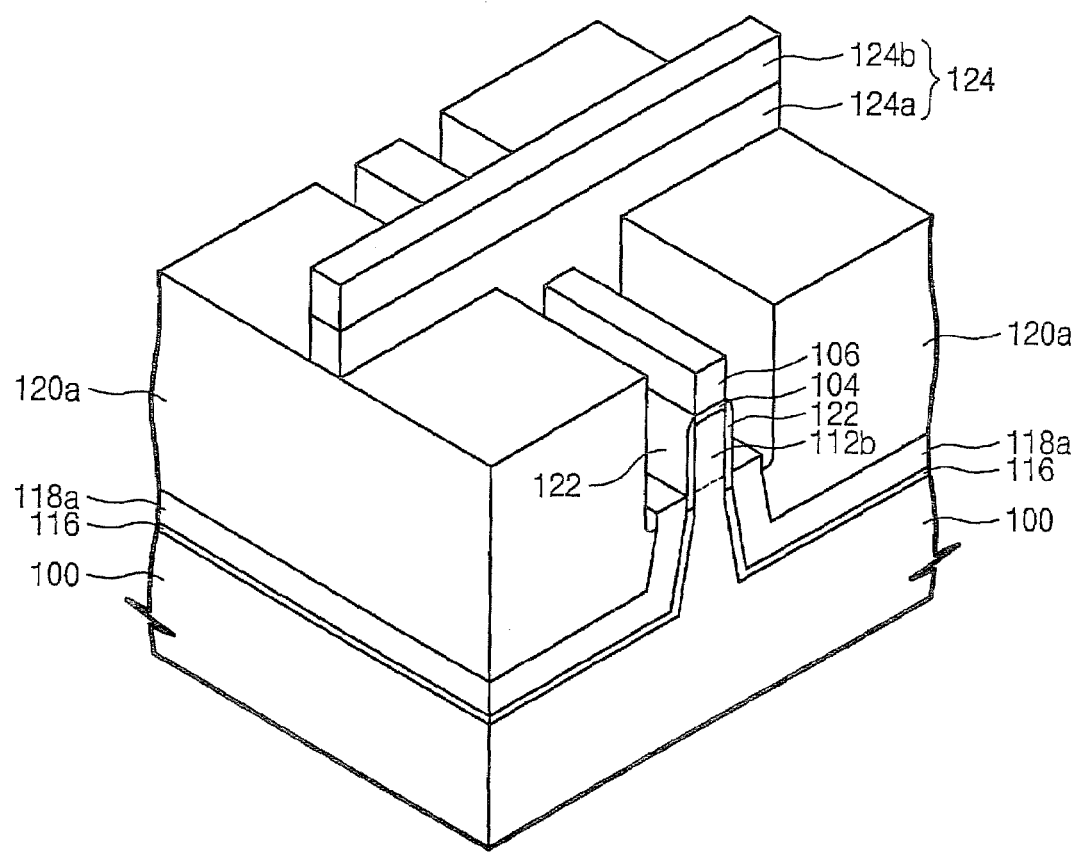

FIGS. 16 through 22 are cross-sectional views showing embodiments of methods of fabricating vertical channel field effect transistors in accordance with the embodiments of FIGS. 15A through C.

Figure 16:
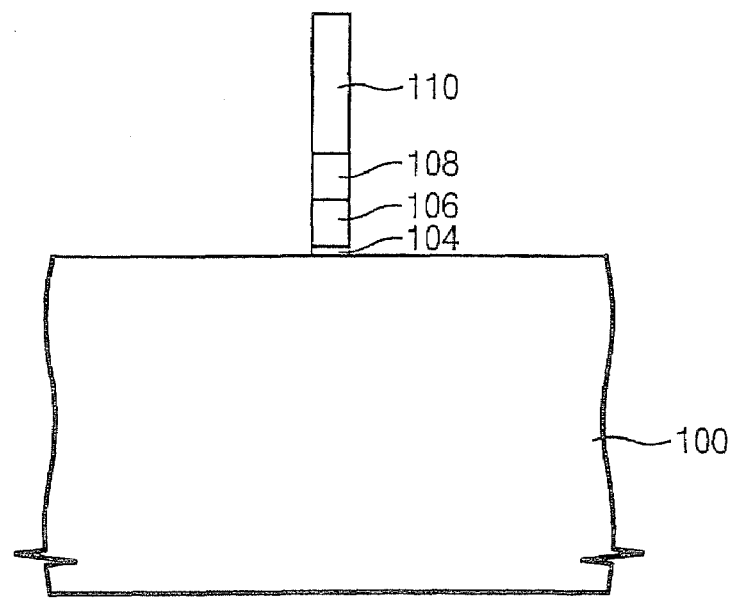
FIGS. 16 through 22 are cross-sectional views showing methods for fabricating a field effect transistor according to some embodiments of the invention.

Referring to FIG. 16, a mask pattern comprising a pad oxide layer 104, an etch stop nitride layer 106, an anti-reflecting layer 108, and a photoresist layer 110 that are sequentially stacked is formed on a semiconductor substrate 100. The pad oxide layer 104 may be formed approximately 0.5-5 nm thick, and the etch stop nitride layer 106 may be formed 5-100 nm thick.

Figure 17:
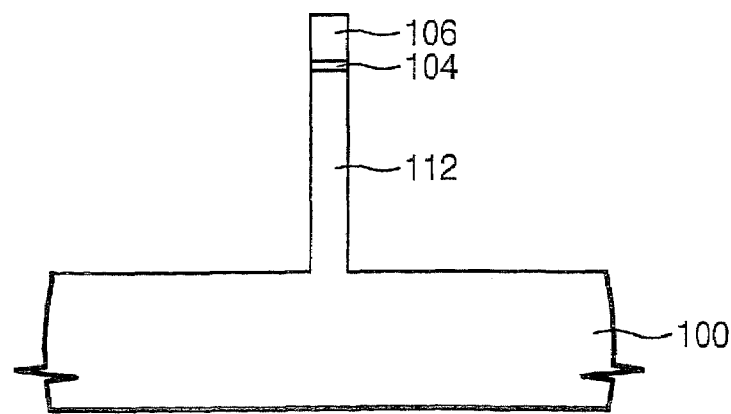

Referring to FIG. 17, the semiconductor substrate 100 is etched 50-1000 nm to form a fin 112, using the mask pattern as an etching mask. Then, the photoresist layer 110 and the anti-reflecting layer 108 are removed, leaving a mask insulating layer comprising the pad oxide layer 104 and the etch stop nitride layer 106 that are stacked.

As described above with reference to FIGS. 6A, 6B and 6C, the fin structure of FIGS. 15B and 15C may be formed using HBr as an etch gas.

Figure 18:
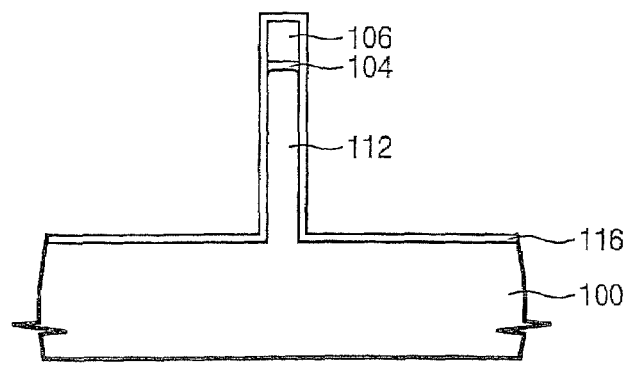
Figure 19:
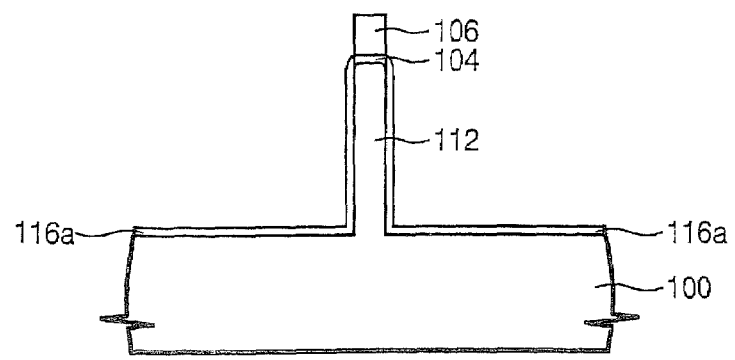

Referring to FIG. 18, a buffer oxide layer 116 is conformally formed on the entire surface of the semiconductor substrate 100. The buffer oxide layer 116 may be a CVD oxide layer formed by chemical vapor deposition, or may be a thermal oxide layer formed by thermal oxidation as illustrated in FIG. 19. The buffer oxide layer 116 can reduce damage resulting from the etching process. A portion of the top edges of the fin 112 may also be thermally oxidized and formed rounded.

Figure 20:
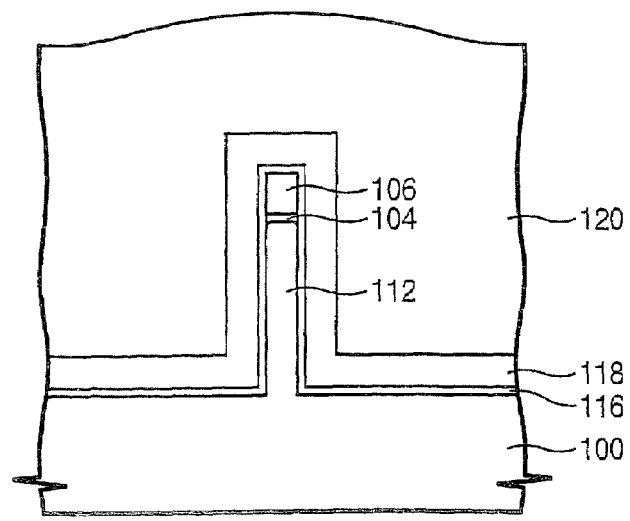

Referring to FIG. 20, a nitride layer 118 is formed 5-100 nm thick on top of the substrate 100 and the buffer oxide layer 116. The buffer oxide layer 116 can reduce stress applied to the substrate by the nitride layer 118. An insulating layer 120 is then formed on the nitride layer 118.

Figure 21:
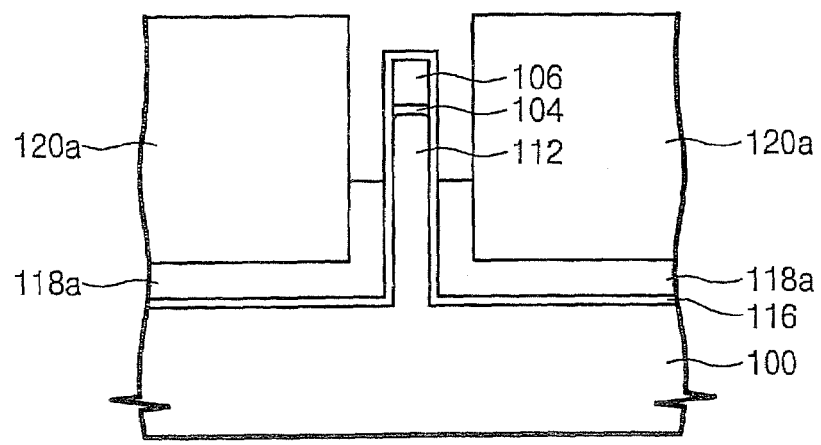

Referring to FIG. 21, the insulating layer 120 is polished by chemical-mechanical polishing to expose the top surface of the nitride layer 118 on the fin 112. The nitride layer 118 is then recessed to form a nitride liner 118a. The remaining insulating layer on the nitride liner 118a forms device isolation layer 120a.

Figure 22:
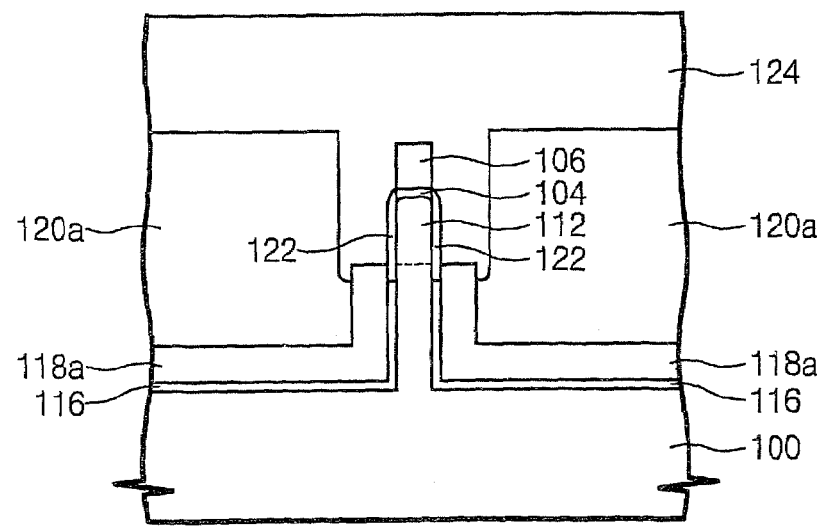

Referring to FIG. 22, a portion of the buffer oxide layer 116 is removed to expose the upper sidewalls of the fin 112. The upper sidewalls of the fin 112 define the channel width of the vertical channel, such that the portion of the nitride layer 118 that is removed can be adjusted according to required characteristics of the transistor. Using thermal oxidation or deposition and anisotropic etching, a gate insulating layer 122 is formed on the upper sidewalls of the fin 112. The gate insulating layer 122 may be formed of silicon oxide, metal oxide, silicon oxynitride, or silicon nitride.

A conductive layer is formed on top of the semiconductor substrate 100 and the gate insulating layer 122, and is then patterned to form a gate electrode 124 crossing over the fin 112. The conductive layer may be a stacked layer of polysilicon and metal silicide, polysilicon germanium and metal silicide, polysilicon and metal, or polysilicon germanium and metal silicide. In addition, a mask insulating layer may be formed on the fin 112, to protect the fin 112 from undesirable etching.

FIGS. 23-28 are cross-sectional views showing further embodiments of the present invention.

Figure 23:
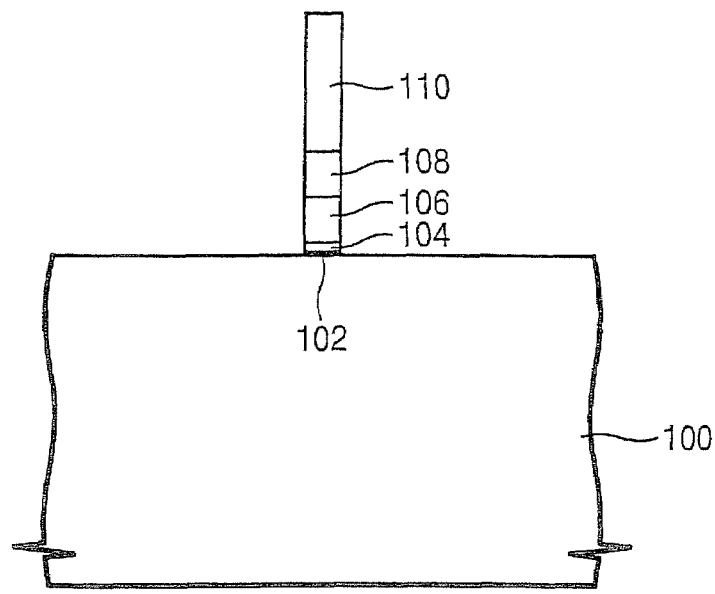
FIGS. 23 through 28 are cross-sectional views showing further embodiments according to the invention.

Referring to FIG. 23, a mask pattern is formed on the semiconductor substrate 100 in order to define a fin. In this embodiment, the mask pattern comprises a pad nitride layer 102, a pad oxide layer 104, an etch stop nitride layer 106, an anti-reflecting layer 108, and a photoresist layer 110. The pad nitride layer 102 may be formed to a thickness that does not overly stress the substrate, for example, a thickness of 0.5-5 nm.

Figure 24:
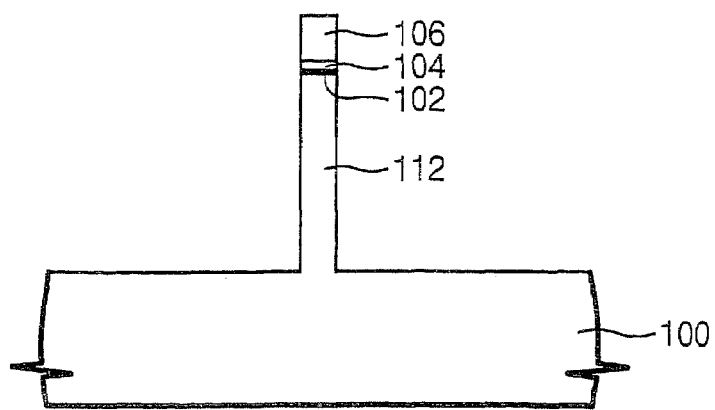

Referring to FIG. 24, the semiconductor substrate 100 is etched, using the mask pattern as an etching mask, to form a fin 112. The photoresist layer 110 and the anti-reflecting layer 108 are then removed, leaving a mask insulating layer comprising the pad nitride layer 102, the pad oxide layer 104, and the etch stop nitride layer 106 that are stacked on the fin 112.

Figure 25:
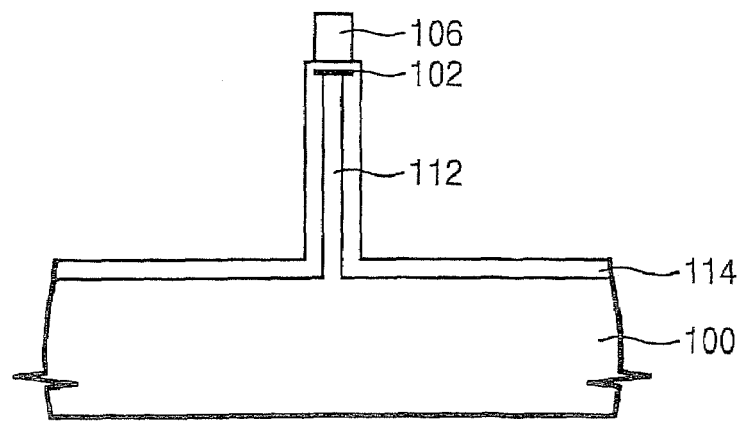

Referring to FIG. 25, thermal oxidation is applied to the semiconductor substrate 100 to form a thermal oxide layer 114, thereby reducing the width of the fin 112. The pad nitride layer 102 restrains oxidation of the fin under the etch stop nitride layer 106 and prevents loss of the etch stop nitride layer 106.

Figure 26:
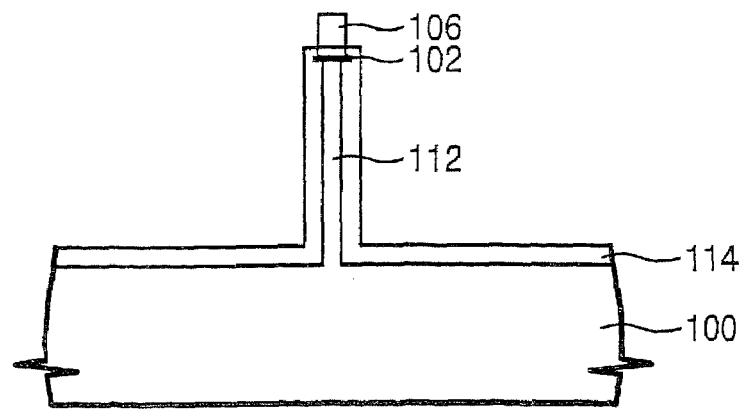

Referring to FIG. 26, the etch stop nitride layer 106 is isotropically etched to a similar width to that of the reduced fin 112.

Figure 27:
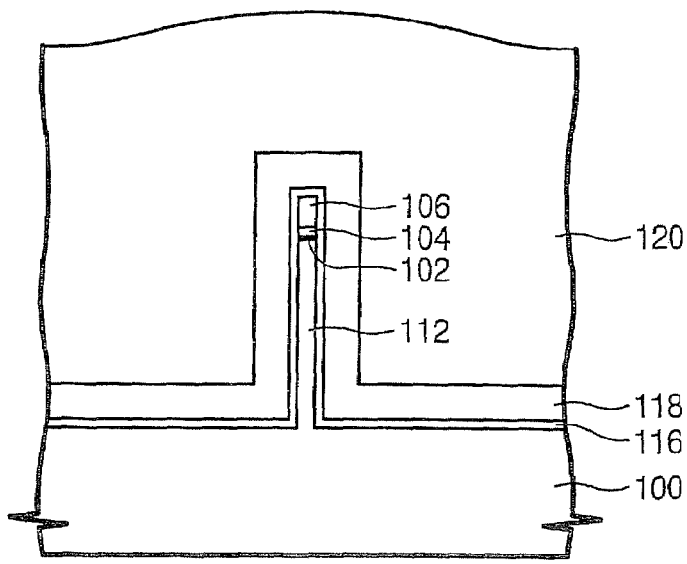

Referring to FIG. 27, the oxide layer 114 is removed by isotropic etching, and the pad nitride layer 102 is isotropically etched to align the sidewalls of the pad nitride layer 102, the pad oxide layer 104, and the etch stop nitride layer 106.

A buffer oxide layer 116 is conformally formed 2-50 nm thick on top of the entire surface of the semiconductor substrate, and a nitride layer 118 is conformally formed 5-200 nm thick on the buffer oxide layer 116. An insulating layer 120 is formed 100-800 nm thick on the nitride layer 118, covering the fin 112.

Figure 28:
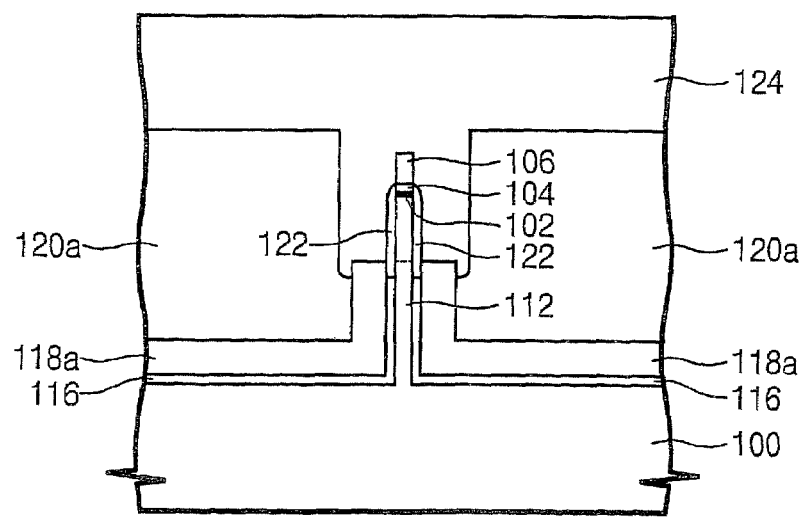

Referring to FIG. 28, the insulating layer 120 is polished using chemical-mechanical polishing to expose the top of the nitride layer 120, forming a device isolation layer 120a around the exposed nitride layer. The upper sidewalls of the fin 112 are exposed and a gate insulating layer 122 and a gate electrode 124 are formed in the same manner as described above.

FIGS. 29 through 32 are cross-sectional views showing further embodiments of the present invention.

Figure 29:
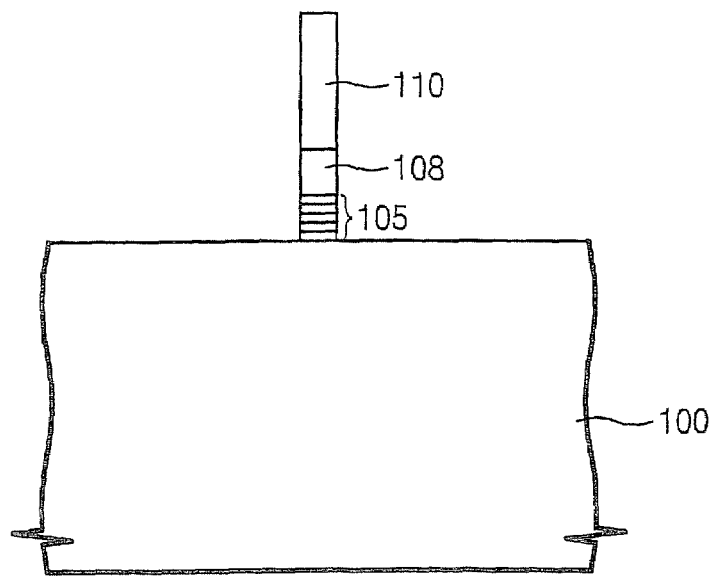
FIGS. 29 through 32 are cross-sectional views showing further methods for fabricating a field effect transistor according to the above embodiments.

Referring to FIG. 29, a mask pattern comprising a mask insulating layer 105, an anti-reflecting layer 108, and a photoresist layer 110 that are stacked is formed on the semiconductor substrate 100. The mask insulating layer 105 is formed by alternately stacking monatomic (i.e., dozens of or hundreds of Angstroms thick) oxide and nitride layers.

Figure 30:
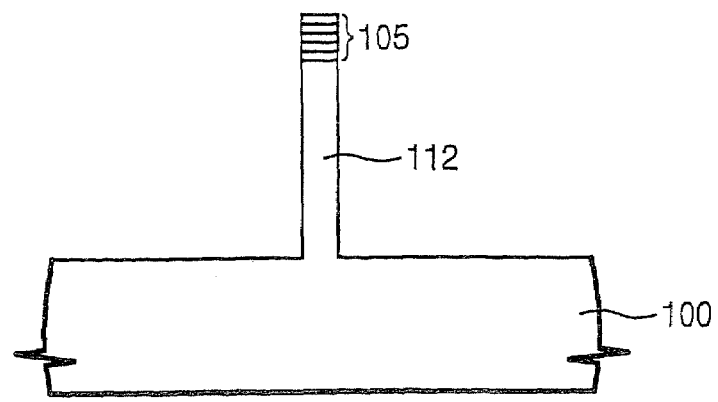

Referring to FIG. 30, the semiconductor substrate 100 is etched using the mask pattern as an etch mask. The photoresist layer 110 and the semiconductor substrate 100 are etched to form a fin 112. The photoresist layer 110 and the anti-reflecting layer 108 are then removed, leaving a mask insulating layer 105 on the fin 112.

Figure 31:
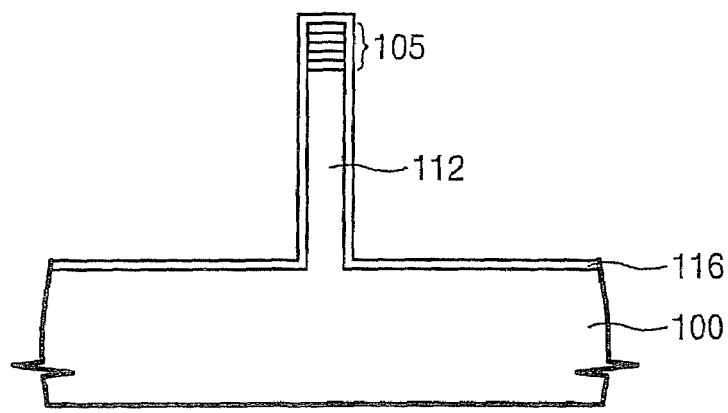

Referring to FIG. 31, a buffer oxide layer 116 is formed on the semiconductor substrate 100. The buffer oxide layer 116 may be formed by thermal oxidation or chemical vapor deposition (CVD).

Figure 32:
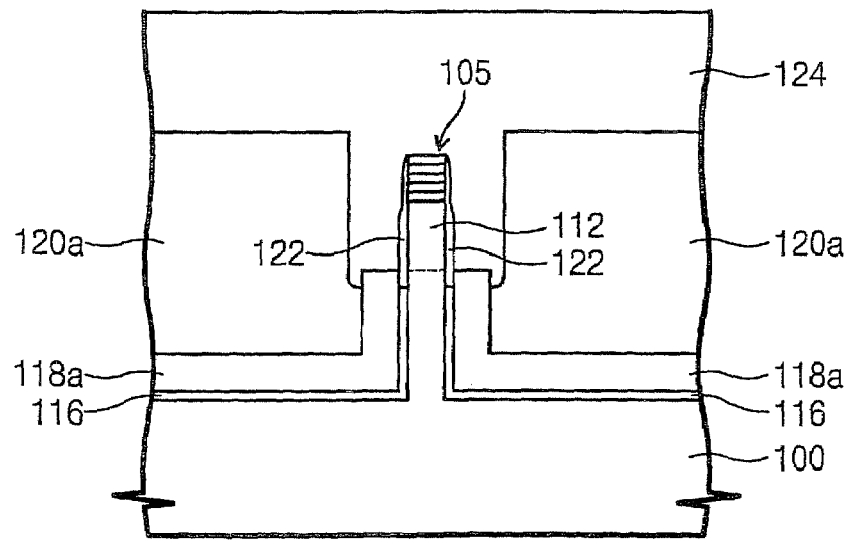

Referring to FIG. 32, a nitride liner 118a, a device isolation layer 120a, a gate insulating layer 122, and a gate electrode 124 are formed in the same manner as described above. The mask insulating layer 105 is formed by thinly stacking oxide and nitride layers, such that the exposed sidewall area of each layer is small. Thus, the nitride layer and the oxide layer effectively complement each other and are not lost during etching of the nitride layer (for forming the nitride liner 118a) and etching of the buffer oxide layer 116 (for exposing the upper sidewalls of the fin 112).

Figure 33:
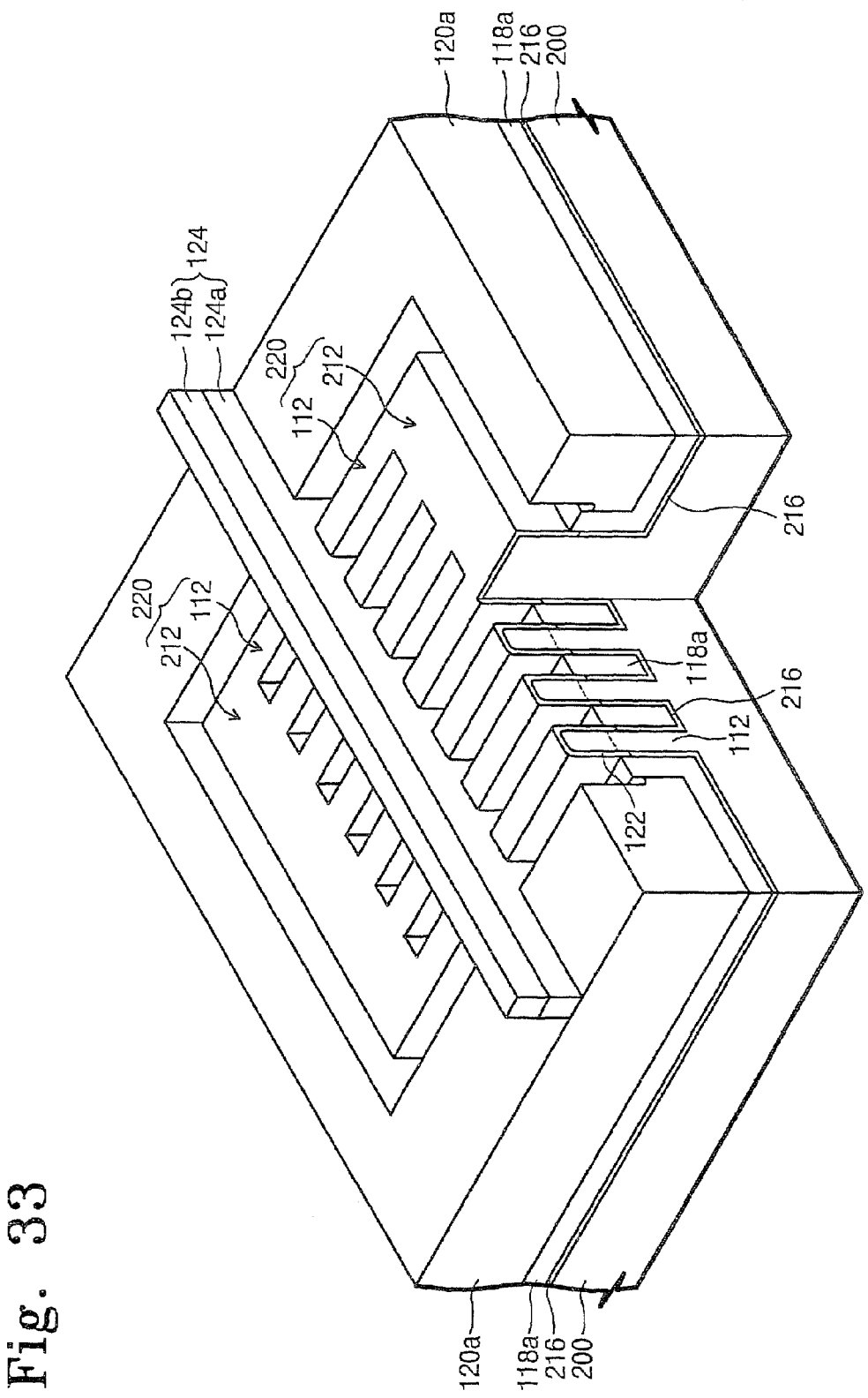
FIG. 33 is a perspective view showing a transistor according to further embodiments of the invention.

FIG. 33 is a cross-sectional view showing a vertical channel field effect transistor in accordance with further embodiments of the invention. This embodiment may provide transistors having high current-driving capacity.

Referring to FIG. 33, a transistor is formed by connecting the transistors according to some of the above described embodiments in parallel. This embodiment includes a plurality of fins 112 that are vertically protruding portions of semiconductor substrate 200. The fins 112 are separated in a lateral direction and positioned parallel to each other. A gate electrode 124 is placed crossing over the plurality of fins 112. Because there are a plurality of fins 112, channel width, and thus current capacity, may be increased by increasing the number of fins.

Referring again to FIG. 33, the transistor further includes a wide planar region 212 at both sides of a gate electrode 124. The wide planar regions 212 are connected to all the fins 112. That is, the transistor comprises a pillar 220 having at least one planar region 212 and a plurality of fins 112 connected to the planar region 212. A buffer oxide layer 216 is formed on the lower sidewalls of the pillar 220. Nitride liners 118a are formed adjacent to the lower sidewalls of the pillar 220, separated from the pillar by the buffer oxide layer 216. The fins 112 are sufficiently spaced so that the nitride liners 118a may be conformally formed on the bottom of the region between the fins 112. In other embodiments, the fins 112 are closely spaced so that the nitride liners 118a fill the region between the fins. Device isolation layers 120a are formed around the pillar 220. The device isolation layers 120a are separated from the pillar 220 by the nitride liner 118a. A gate insulating layer 122 is formed on upper sidewalls of the pillar 220, forming a boundary with the buffer oxide layer 216 on the lower sidewalls of the pillar 220. A gate electrode 124 is positioned crossing over the fins. The transistor includes source and drain regions (not shown) formed in the planar regions 212 and in the fins 112 at both sides of the gate electrode 124, and a channel region (not shown) formed in the fins 112 under the gate electrode 124.

As described in the above embodiments, the top edges of the fins 112 may be formed rounded. In addition, the fins 112 may increase in width from top to bottom or may be uniform in width at the upper portion but increase in width at the lower portion.

A mask insulating layer may be further formed on top of the pillar 220 in a manner similar to the embodiments described above. Similarly, the transistor may be formed by methods according to the embodiments described above.

According to some embodiments of the present invention, a bulk substrate is etched to form fin. Upper sidewalls of the fin or upper sidewalls and a top surface thereof are used as the channel of the transistor for improving thermal conductivity and reducing floating body effect compared to a vertical channel transistor formed in SOI substrate. Furthermore, using bulk wafer reduces fabrication costs and depresses defects in the substrate compared to SOI substrate.

In some embodiments, a plurality of fins are disposed in parallel to achieve the above structure without forming intrinsic transistors. Therefore, a complete depletion type transistor or complete inversion type transistor can be formed which has good current driving performance.

In the drawings and specification, there have been disclosed embodiments according to the invention and, although, specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A method of forming a transistor comprising:
   forming a vertical channel protruding from a substrate including a source/drain region junction between the vertical channel and the substrate;
   forming an insulating layer extending on a side wall of the vertical channel toward the substrate to beyond the source/drain region junction; and
   forming a nitride layer extending on the side wall away from the substrate to beyond the insulating layer.

2. A method according to claim 1, wherein the step of forming an insulating layer further comprises forming the insulating layer on a top surface of the channel.

3. A method according to claim 1, wherein the nitride layer is absent from beyond the junction.

4. A method according to claim 1, further comprising:
   forming a second insulating layer extending on the side wall, wherein the second insulating layer is separated from the channel by the nitride layer.

5. A method according to claim 1 further comprising:
   forming a gate electrode extending on the side wall toward the substrate to beyond the source/drain region junction.

6. A method of forming a transistor, the method comprising:
   forming a vertical channel protruding from a substrate including a source/drain region junction between the vertical channel and the substrate;
   forming an oxide layer on the vertical channel;
   removing the oxide layer to reduce a channel width of the vertical channel; and
   forming an insulating layer extending on a side wall of the vertical channel toward the substrate to beyond the source/drain region junction.

7. A method according to claim 6, wherein the step of forming an oxide layer is preceded by forming a pad oxide layer and an oxidation mask layer on the channel, and wherein the step of removing the oxide layer further comprises removing the pad oxide layer and the oxidation mask layer.

8. A method according to claim 1, wherein the step of forming a vertical channel is preceded by forming a mask insulating layer on a substrate.

9. A method of forming a transistor, the method comprising:
   forming a mask insulating layer on a substrate, wherein the mask insulating layer comprises alternating oxide and nitride layers;
   forming a vertical channel protruding from the substrate including a source/drain region junction between the vertical channel and the substrate; and
   forming an insulating layer extending on a side wall of the vertical channel toward the substrate to beyond the source/drain region junction.

10. A method of fabricating a transistor comprising:
    etching a semiconductor substrate to form a fin;
    conformally forming a buffer oxide layer and a nitride layer on the semiconductor substrate;
    forming an insulating layer thicker than the fin on the semiconductor substrate with the nitride layer;
    polishing the insulating layer using chemical-mechanical polishing to expose the nitride layer and to form device isolating layers surrounding the nitride layer;
    successively recessing the nitride layer and the buffer oxide layer to form an exposed upper portion of the fin and to form a nitride liner adjacent to the lower sidewalls of the fin;
    forming a gate oxide layer on the exposed portion of the fin; and
    forming a gate electrode crossing over the fin.

11. A method of fabricating a transistor comprising:
    forming a mask insulating layer on a semiconductor substrate;
    patterning the mask insulating layer and the semiconductor substrate to form a fin that is a vertically protruding portion of the semiconductor substrate;
    conformally forming a buffer oxide layer and a nitride layer on the semiconductor substrate;
    forming an insulating layer thicker than the fin on the semiconductor substrate with the nitride layer;
    polishing the insulating layer using chemical-mechanical polishing to expose the nitride layer and to form device isolating layers surrounding the nitride layer;
    successively recessing the nitride layer and the buffer oxide layer to form exposed upper sidewalls of the fin and to form a nitride liner adjacent to the lower sidewalls of the fin;
    forming a gate oxide layer on the exposed upper sidewalls of the fin; and
    forming a gate electrode crossing over the fin.

12. A method of fabricating a transistor comprising:
    etching a semiconductor substrate to form a pillar including a couple of planar regions and a plurality of fins that connect the planar regions;
    conformally forming a buffer oxide layer and a nitride layer on the semiconductor substrate with the pillar;
    forming an insulating layer thicker than the pillar on the semiconductor substrate;
    polishing the insulating layer using chemical-mechanical polishing to expose the nitride layer and to form device isolating layers surrounding the pillar;
    successively recessing the nitride layer and the buffer oxide layer to form an exposed upper portion of the pillar;
    forming a gate oxide layer on the exposed portion of the pillar; and
    forming a gate electrode crossing over the fins.

* * * * *